(12) United States Patent
Wong

(10) Patent No.: US 6,314,025 B1
(45) Date of Patent: Nov. 6, 2001

(54) HIGH DATA RATE WRITE PROCESS FOR NON-VOLATILE FLASH MEMORIES

(75) Inventor: Sau C. Wong, Hillsborough, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 09/670,764

(22) Filed: Sep. 27, 2000

Related U.S. Application Data

(63) Continuation of application No. 09/128,225, filed on Aug. 3, 1998, now Pat. No. 6,134,145, which is a continuation-in-part of application No. 09/103,623, filed on Jun. 23, 1998, now Pat. No. 5,969,986.

(51) Int. Cl.$^7$ .................................................. G11C 16/00
(52) U.S. Cl. ............................... 365/185.22; 365/185.11; 365/185.28
(58) Field of Search .................... 365/185.11, 185.22, 365/185.23, 185.28, 185.29, 185.33, 230.03; 711/169

(56) References Cited

U.S. PATENT DOCUMENTS

| | | | |
|---|---|---|---|
| 4,054,864 | 10/1977 | Audaire et al. | 340/173 |
| 4,057,788 | 11/1977 | Sage | 365/174 |
| 4,181,980 | 1/1980 | McCoy | 365/45 |
| 4,200,841 | 4/1980 | Nagata et al. | 455/169 |
| 4,318,188 | 3/1982 | Hoffman | 365/45 |

(List continued on next page.)

FOREIGN PATENT DOCUMENTS

| | | |
|---|---|---|
| 3644322 | 7/1988 | (DE) . |
| 0798739 | 10/1995 | (EP) . |

OTHER PUBLICATIONS

Press Release: Intel Announces Multilevel Cell Flash Technology, Intel Corporation, 1994, 3 pages.
"Solutions OEM," A Publication of Intel Corporation, vol. 2, No. 2, (Autumn) Sep. 1994, pp. 1–8.

(List continued on next page.)

*Primary Examiner*—Tan T. Nguyen
(74) *Attorney, Agent, or Firm*—Skjerven Morrill MacPherson LLP

(57) ABSTRACT

A non-volatile semiconductor memory includes: multiple write pipelines, each including a memory array; a timing circuit which sequentially starts programming operations in the pipelines; and a shared charge pump and voltage regulation circuit that drives a current through the memory cells being programmed. Staggering the starts of programming operations reduces the current demand on the charge pump because spikes that occur at the starts of programming operations, for example, when using channel hot electron injection, are distributed over time rather than occurring all at once. Noise, which can reduce the accuracy of write operations, is also reduced because the total current required from the charge pump is more nearly constant. As further aspect of the invention, each write pipeline can perform a write operation as alternating programming cycles and verify cycles. During a programming cycle, the shared charge pump drives a current through a selected memory cell to change the threshold voltage of the selected memory cell. During a verify cycle, the write circuit determines whether the selected memory cell has reached its target threshold voltage level. The write pipelines can be partitioned into two banks where pipelines in one bank perform programming cycles while pipelines in the other bank perform verify cycles. More generally the write pipelines are partitioned into multiple banks where each bank starts programming cycles at times that differ from the starts of programming cycles in the other banks.

3 Claims, 6 Drawing Sheets

U.S. PATENT DOCUMENTS

| | | | |
|---|---|---|---|
| 4,627,027 | 12/1986 | Rai et al. | 365/45 |
| 4,809,223 | 2/1989 | Brown | 365/45 |
| 4,852,063 | 7/1989 | McNutt | 365/185 |
| 4,890,259 | 12/1989 | Simko | 365/45 |
| 4,935,702 | 6/1990 | Mead et al. | 330/9 |
| 4,989,179 | 1/1991 | Simko | 365/45 |
| 5,028,810 | 7/1991 | Castro et al. | 307/201 |
| 5,055,897 | 10/1991 | Canepa et al. | 357/23.5 |
| 5,126,967 | 6/1992 | Simko | 365/45 |
| 5,163,021 | 11/1992 | Mehrotra | 365/185 |
| 5,164,915 | 11/1992 | Blyth | 365/45 |
| 5,168,465 | 12/1992 | Harari | 257/320 |
| 5,172,338 | 12/1992 | Mehrotra et al. | 365/185 |
| 5,218,569 | 6/1993 | Banks | 365/189.01 |
| 5,220,531 | 6/1993 | Blyth et al. | 365/189.07 |
| 5,239,500 | 8/1993 | Oguey | 365/45 |
| 5,241,494 | 8/1993 | Blyth et al. | 365/45 |
| 5,243,239 | 9/1993 | Khan et al. | 307/521 |
| 5,262,984 | 11/1993 | Noguchi et al. | 365/185 |
| 5,272,669 | 12/1993 | Samachisa et al. | 365/185 |
| 5,294,819 | 3/1994 | Simko | 257/314 |
| 5,339,270 | 8/1994 | Jiang | 365/185 |
| 5,394,362 | 2/1995 | Banks | 365/189.01 |
| 5,430,670 | 7/1995 | Rosenthal | 365/45 |
| 5,519,654 | 5/1996 | Kato et al. | 365/185.23 |
| 5,519,847 | 5/1996 | Fandrich et al. | 365/185.33 |
| 5,680,341 | 10/1997 | Wong et al. | 365/45 |
| 5,694,356 | 12/1997 | Wong et al. | 365/185.22 |
| 5,712,815 | 1/1998 | Bill et al. | 365/185.22 |
| 5,781,474 | 7/1998 | Sali et al. | 365/185.23 |
| 5,784,319 | 7/1998 | Villa et al. | 365/185.21 |
| 5,848,013 | 12/1998 | Caser et al. | 365/185.23 |
| 5,867,430 | 2/1999 | Chen et al. | 365/185.11 |
| 6,134,145 * | 10/2000 | Wong | 365/185.22 |

OTHER PUBLICATIONS

Ajika et al., "A 5 Volt Only 16M BIT Flash EEPROM Cell With A Simple Stacked Gate Structure", (Reprinted from IEDM Tech. Dig., 1990, pp. 115–118), LSI R & D Lab., Paper 5.11, pp. 209–212.

Chen et al., "Subbreakdown Drain Leakage Current in MOSFET", IEEE, 1987, pp. 515–517.

Dov Frohman–Bentchkowsky," A Fully Decoded 2048–Bit Electrically Programmable FAMOS Read–Only Memory" (reprinted from IEEE J. Solid–State Circuits, vol. SC–6, #5, 10/71, pp. 301–306) pp. 63–68.

Lenzinger et al., "Fowler–Nordheim Tunneling into Thermally Grown $SiO_2$", Journal of Applied Physics, vol. 40, No. 1, 01/69, pp. 278–283.

Haddad et al., "Degradations Due To Hole trapping in Flash Memory Cells", 1989, IEEE Electron Device Lett., vol. 10, No. 3, pp. 117–119.

Hoe et al., "Cell and Circuit Design for Single–Poly EPROM", 1989, IEEE Journal of Solid–State Circuits, vol. 24, No. 4, pp. 1153–1157.

Johnson et al., "A 16Kb Electrically Erasable Nonvolatile Memory", IEEE ISSCC, Dig. Tech. pap. 1980, pp. 125–127.

Kamiya et al, "EPROM Cell With High Gate Injection Efficiency", IEDM Tech. Dig. 1982 (reprint) pp. 741–744.

Kazerounian et al., "A 5 Volt High Density Poly–Poly Erase Flash EPROM Cell", IEDM Tech. Dig., 1988 (reprint) pp. 202–205.

Kynett et al., "An In–System Reprogrammable 32Kx8 CMOS Flash Memory", IEEE J. Solid–State Circuits, vol.. 23, No. 5, 10/88 (reprint), pp. 170–175.

Naruke et al., "A New Flash–Erase EEPROM Cell With a Sidewall Select–Gate On Its Source Side", IEDM Tech. Dig., 1989 (reprint) pp. 183–186.

Perlegos et al., "A 64K EPROM Using Scaled MOS Technology", IEEE ISSCC Dig. Tech. Pap., 1980 (reprint) pp. 69–71.

Wu et al., "A Novel High–Speed, 5 Volt Programming EPROM Structure With Source–Side Injection", IEDM Tech. Dig., 1986 (reprint) pp. 108–111.

* cited by examiner

HIGH DATA RATE WRITE PROCESS FOR NON-VOLATILE FLASH MEMORIES

CROSS REFERENCE TO RELATED APPLICATION

This patent document is a continuation of U.S. patent application Ser. No. 09/128,225, filed Aug. 3, 1998, now U.S. Pat. No. 6,134,145, which is a continuation-in-part of U.S. patent application Ser. No. 09/103,623, filed Jun. 23, 1998, now U.S. Pat. No. 5,969,986, which is incorporated by this reference in its entirety.

BACKGROUND

1. Field of the Invention

This invention relates to write processes for non-volatile memories and particularly to methods of reducing the current required when writing at a high data rate.

2. Description of Related Art

Semiconductor non-volatile memories such as EPROM, EEPROM, and flash memories, which permit electrical erasing and programming of memory cells, are well known. Such memories conventionally include arrays of memory cells where each memory cell includes a floating gate transistor. Write and erase circuits coupled to an array write to or erase a memory cell in the array by electrically charging or discharging the floating gate of the floating transistor in the memory cell to change the threshold voltage of the transistor. In particular, to write to a selected memory cell, the write circuit charges the floating gate of the floating gate transistor in the selected memory cell until the threshold voltage of the transistor is at a level that represents the value being written.

One write method for a non-volatile memory cell uses channel hot electron injection. A typical channel hot electron injection process applies a high voltage (about 12 volts) to the control gate of a floating gate transistor, applies a high voltage (about 5 volts) to the drain of the floating gate transistor, and grounds the source of the floating gate transistor. The high drain-to-source voltage causes a relatively large current through the floating gate transistor. The high control gate voltage attracts energetic (or hot) electrons that can pass from the channel through an insulating layer to the floating gate of the floating gate transistor. As electrons accumulate in the floating gate, the threshold voltage of the floating gate transistor increases, the drain-to-source current falls, and the rate of increase in the threshold voltage drops.

Conventional integrated circuit non-volatile memory currently uses a supply voltage between about 3 volts and about 5 volts. Accordingly, a non-volatile memory using channel hot electron injection for programming typically requires charge pumps to generate the high control gate voltage and the high drain voltage. The sizes of such charge pumps determine the number of memory cells that can be programmed in parallel. In particular, to program N cells in parallel a charge pump must be able to supply N times the current drawn by a single memory cell. At the start of a programming operation, the drain-to-source current through a memory cell being programmed is highest and places the greatest load on the charge pump supplying the drain voltage. Specifically, the charge pump supplies a maximum drain-to-source current Idsmax to each of N memory cells at the start of a parallel programming operation, and the charge pump must be able to supply a total current of N*Idsmax without an unacceptable drop in the drain voltage. If the required programming current could be reduced, a smaller charge pump could be employed which can reduce the overall memory circuit size and cost. Additionally, power consumption could be reduced, which is crucial for portable or battery operated applications.

Another concern in a non-volatile memory that stores an analog value or multiple bits of information in each memory cell is the precision of the write operation. Best precision and repeatability require nearly constant supply and programming voltages during programming. However, as noted above for programming operations, current drain is high at the beginning of the programming operation and falls as a memory cell threshold voltage rises. Accordingly, the charge pumps and the supply voltage in the memory are subject to changing current demands which cause voltage fluctuations or noise that can affect the accuracy and repeatability of write operations. Thus, methods of reducing current consumption, voltage fluctuations, and noise during programming are desired.

SUMMARY

In accordance with the invention, a non-volatile memory has multiple write pipelines that are sequentially started on programming operations and has a shared charge pump that supplies drain-to-source currents during the programming operations. With sequential starts, the programming operations are staggered, and the peak current for the multiple programming operations do not occur at the same time. Accordingly, sequential starting of programming operations in the write pipelines avoids the high combined peak current that occurs in memories that simultaneously start multiple programming operations. The staggered operations of the write pipelines also provide a high data rate because all of the write pipelines can operate at the same time to provide the same data rate as a conventional memory that performs parallel programming operations. The smaller peak current allows the charge pump and associated voltage regulation circuitry to be smaller than similar circuitry used in conventional memory that performs parallel programming operations. Additionally, since spikes in the current from the charge pump are relatively small, memories with sequential or staggered programming operations generate less noise in the supply voltage during programming, and permit accurate programming for applications such as analog or multiple-bits-per-cell storage.

One embodiment of the invention is a non-volatile semiconductor memory that includes multiple write pipelines, a shared charge pump, and a timing circuit. Each of the write pipelines includes an array of non-volatile memory cells and a write circuit coupled to the associated array. When started on a programming operation for a selected memory cell in the associated array, a write circuit applies a programming voltage to the selected memory cell to drive a current through the selected memory cell, for example, to cause channel hot electron injection which raises a threshold voltage in the selected memory cell. The charge pump generates the programming voltage from a supply voltage and supplies the programming voltage to all of the write pipelines for the programming operations. The timing circuit sequentially starts the programming operations by the write circuits. Accordingly, at most one write pipeline at a time requires the maximum programming current from the charge pump, and the charge pump and any associated voltage regulation circuitry can be smaller than that required in a memory that simultaneously starts multiple programming operations. The shared charge pump and sequential starting of programming operations can be beneficially employed in a binary memory, a multiple-bits-per-cell memory, and an analog memory.

Each write pipeline may additionally include selection circuitry that selects a voltage applied to the selected memory cell during programming. The selection circuitry selects the programming voltage for changing the threshold voltage of the selected memory cell during a series of programming cycles and selects a second voltage for testing the threshold voltage of the selected memory cell during a series of verify cycles. The programming operation in a pipeline ends when a verify cycle determines that the threshold voltage of the selected cell reaches its target level. The write pipelines can be divided into two banks, a bank of even numbered pipelines and a bank of odd numbered pipelines, such that when a programming operation in an even pipeline overlaps a programming operation in an odd pipeline, the even pipeline performs programming cycles and verify cycles when the odd pipeline respectively performs verify cycles and programming cycles. The interleaving programming and verify cycles in this fashion cuts the peak and average current requirement in half because at most one half of the write pipelines draw current from the charge pump at a time. Alternatively, the pipelines can be partitioned into three or more banks where each bank starts programming cycles at a different time.

BRIEF DESCRIPTION OF THE DRAWINGS

Use of the same reference symbols in different figures indicates similar or identical items.

DETAILED DESCRIPTION OF THE PREFERRED EMBODIMENTS

A non-volatile floating-gate memory in accordance with an embodiment of the invention performs pipelined writes that stagger the starts of channel hot electron injection processes. The pipelined writes provide a high data rate by programming multiple memory cells at a time. However, the programming operations do not start or end simultaneously and are at different stages of completion. In accordance with an aspect of the invention, a single charge pump supplies a high voltage that drives drain-to-source currents for programming processes such as channel hot electron injection in multiple memory cells. Since the programming operations have staggered starts, the maximum current that the charge pump must provide is less than the peak current for a single programming operation times the number of memory cells being simultaneously programmed. Accordingly, at a fixed data rate, the charge pump required for the pipelined write scheme can be smaller than the charge pump required for a parallel write scheme that starts multiple programming operations simultaneously. Further, staggering starts of programming operations smoothes the current drawn for the write operation and reduces noise that could disturb the accuracy of the write operation. These aspects of the invention can be beneficially applied in binary (i.e., one-bit-per-cell) memories, multiple-bits-per-cell memories, and analog memories.

Figure 1:
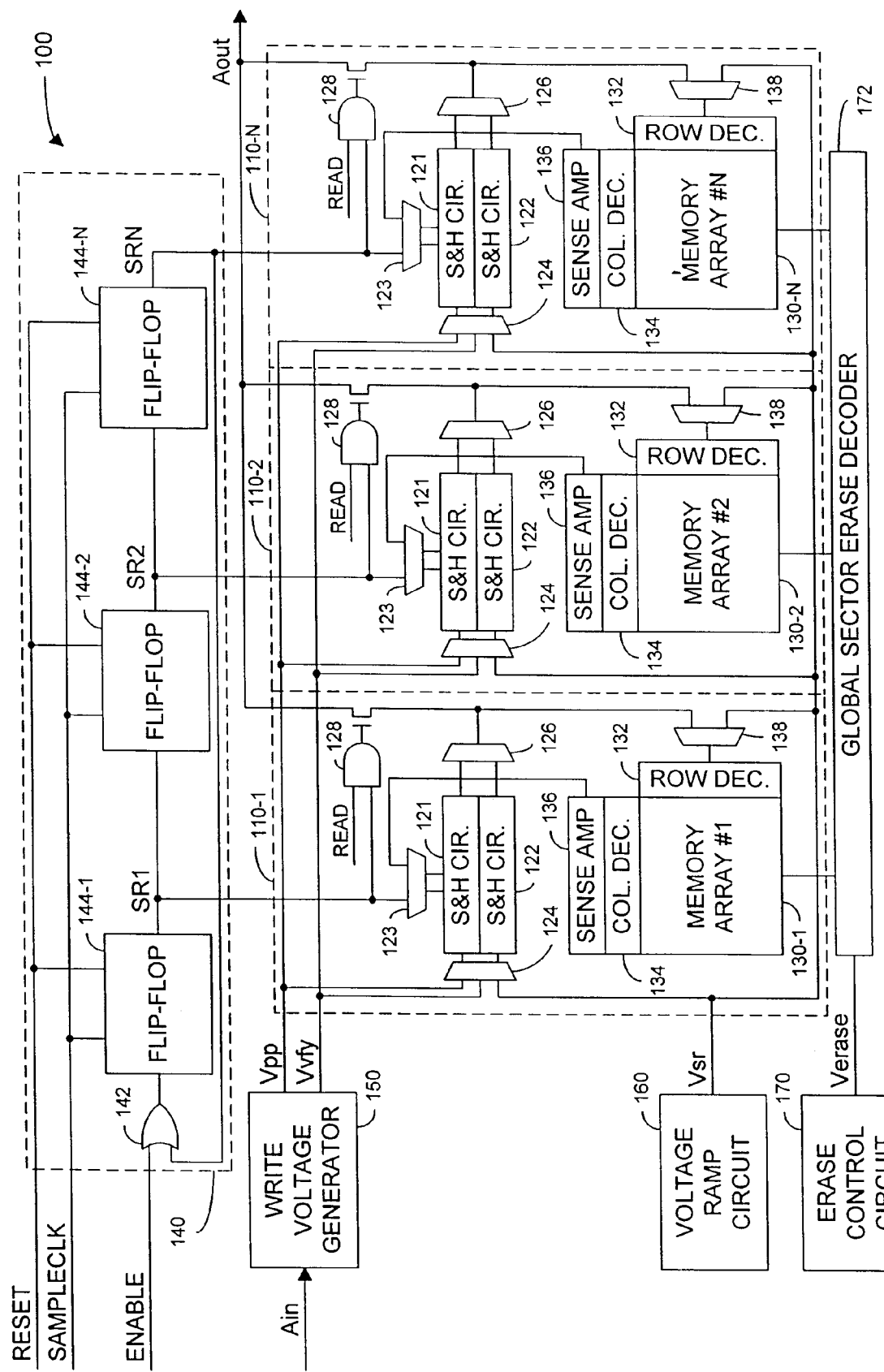
FIG. 1 is a block diagram of a non-volatile semiconductor memory in accordance with an embodiment of the invention.

FIG. 1 is a block diagram of a non-volatile memory 100 in accordance with an embodiment of the invention. Memory 100 includes multiple arrays 130-1 to 130-N of Flash memory cells in respective write pipelines 110-1 to 110-N. Write pipelines 110-1 to 110-N and memory arrays 130-1 to 130-N are sometimes referred to herein as pipelines 110 and arrays 130. Although FIG. 1 shows three pipelines 110, memory 100 can include any number N of pipelines. The number of pipelines provided determines the number of programming operations memory 100 conducts at a time and accordingly controls the maximum write frequency or data rate of memory 100. As described more fully below for a pipelined write or recording of data, a timing circuit 140 sequentially starts pipelines 110 on programming operations, and pipelines 110 operate individually to complete the programming operations.

Each non-volatile memory array 130 can be a conventional non-volatile memory array. Such memory arrays are known for storing a binary, analog, or multi-bit digital value in each memory cell. Arrays 130 include rows and columns of memory cells, where each memory cell is, for example, a single floating gate transistor, a split gate transistor, or a multiple-transistor memory cell. In an exemplary embodiment of the invention, which is described below, memory 100 is a flash EEPROM, and each memory cell consists of a single N-channel floating gate transistor. Other memory architectures are also suitable. Control gates of the memory cells in a row of an array 130 are coupled to a row line associated with the row. Drains of the memory cells in a column of an array 130 are coupled to a column line associated with the column, and sources of the memory cells in a sector of an array 130 are coupled to a source line associated with the sector. In the exemplary embodiment, each sector contains multiple columns of memory cells but alternative memory architectures use different kinds of sectors, for example, sectors containing one or multiple rows of memory cells.

Memory arrays 130 are separate in that a programming operation in one array 130 does not directly affect programming operations in other arrays 130. Each memory array 130 has a row decoder 132 and a column decoder 134. Each row decoder 132 receives a row address signal, selects a row line in the associated array 130, and during a programming operation, conveys bias voltages to the selected row line and unselected row lines in the associated array 130. Each column decoder 134 receives a column address signal, selects a column line in the associated array 130, and conveys bias voltages to the selected column line and unselected column lines in the associated array 130 during write operations.

Memory 100 is capable of performing two types of write operations. The first type, referred to herein as a pipelined write operation, sequentially starts programming operations in pipelines 110-1 to 110-N and ends when the programming in memory array 130-N is complete. The second type of write operation, referred to herein as a recording operation, cyclically starts programming operations in pipelines 110-1 to 110-N and continues until after a signal RESET is asserted to stop the recording. In general, the pipelined write operation stores a fixed amount of data in arrays 130, and a recording operation stores a continuous data stream of variable length in memory arrays 130.

Timing circuit 140 starts and controls pipelined write operations and recording operations in pipelines 110. In the exemplary embodiment of the invention, timing circuit 140 includes N flip-flops 144-1 to 144-N that are connected to operate as a shift register. Flip-flops 144-1 to 144-N respectively correspond to read/write pipeline 110-1 to 110-N and start the corresponding pipelines 110 on programming operations at falling edges of output signals SR1 to SRN.

Write circuits 120-1 to 120-N (some times referred to herein as write circuits 120) control programming operations in respective pipelines 110-1 to 110-N. In particular, write circuits 120-1 to 120-N receive respective data values from respective data sources 125-1 to 125-N, and as timing circuit 140 starts each write circuit 120, the write circuit generates programming signals VROW and VCOL that associated row and column decoders 132 and 124 apply to a selected memory cell being programmed in the associated array 130. The structures of write circuits 120 and data sources 125 depend on the type of data values being stored the associated memory array. In one alternative embodiment, memory 100 is an analog memory, and data sources 125-1 to 125-N are sample-and-hold circuits that sample an input analog signal at rising edges of the associated signals SR1 to SRN. U.S. Pat. No. 5,680,341 to Wong et al., which is hereby incorporated by reference in it entirety, describes analog memories with multiple read/write pipelines and describes use of sample-and-hold circuits and write circuits for analog memories.

In another alternative embodiment, memory 100 is a binary or multiple-bits-per-cell memory. For binary and multiple-bits-per-cell memories, each data source 125 can include one or more latches, flip-flops, or volatile memory cells (e.g., SRAM or DRAM cells) that temporarily hold one or more bits of data for writing to the selected non-volatile memory cell in the associated array 130. When the associated one of signals SR1 to SRN starts a write circuit 120, the write circuit 120 generates programming signals VROW and VCOL which row decoder 132 and column decoder 134 respectively apply to the selected row and column lines to write the data value from the associated data source 125 to the selected memory cell.

In one specific embodiment of the invention, memory 100 is a binary memory where each memory cell has a low threshold voltage when in an erased state representing a binary 0. (Clearly, other interpretations of the threshold voltages of memory cells are possible. For example, a low threshold voltage could represent a binary 1.) For this embodiment, each data source 125 includes a latch, and at the start of a pipelined write operation, data sources 125 collectively and in parallel latch a multi-bit input data value, one bit per data source 125. Timing circuit 140 then begins sequentially starting write circuits 120-1 to 120-N on programming operations. Each write circuit 120 receives a data bit from the associated data source. If the data bit is a binary one, the write circuit 120 generates row signal VROW and column signal VCOL at high voltages Vcp and Vw. (Typically, voltage Vcp is about 12 to 13 volts and voltage Vw is about 5 to 6 volts.) In accordance with an aspect of the invention, a single charge pump 150 generates voltage Vw for all of the write circuits 120-1 to 120-N. The combination of a grounded source line, voltage Vcp being applied to the selected row line, and Vw being applied to the selected column line induces channel hot electron injection in the selected memory cell which increases the threshold voltage of the selected memory cell. Write circuit 120 continues programming the selected memory cell for a fixed time that is sufficient to raise the threshold voltage of the selected memory above a cut-off level so that the threshold voltage of the selected memory cell after programming represents a binary one. If the data bit from a data source 125 is binary zero, the associated write circuit grounds signal VCOL so that the selected memory cell remains in the threshold voltage state representing a binary zero.

The pipelined write operation for the binary memory embodiment is complete when the last write pipeline 110-N finishes its programming operation. However, another pipelined operation can begin before a previous pipelined write operation is complete if latching a new input value into data sources 125 will not interfere with the previously started pipelined operation and if starting a programming operation in pipeline 110-1 will not interfere with a programming operation previously started in pipeline 110-1. Accordingly, memory 100 can achieve the same write frequency or data rate as a memory using N simultaneously-started, parallel programming operations.

Figure 2:
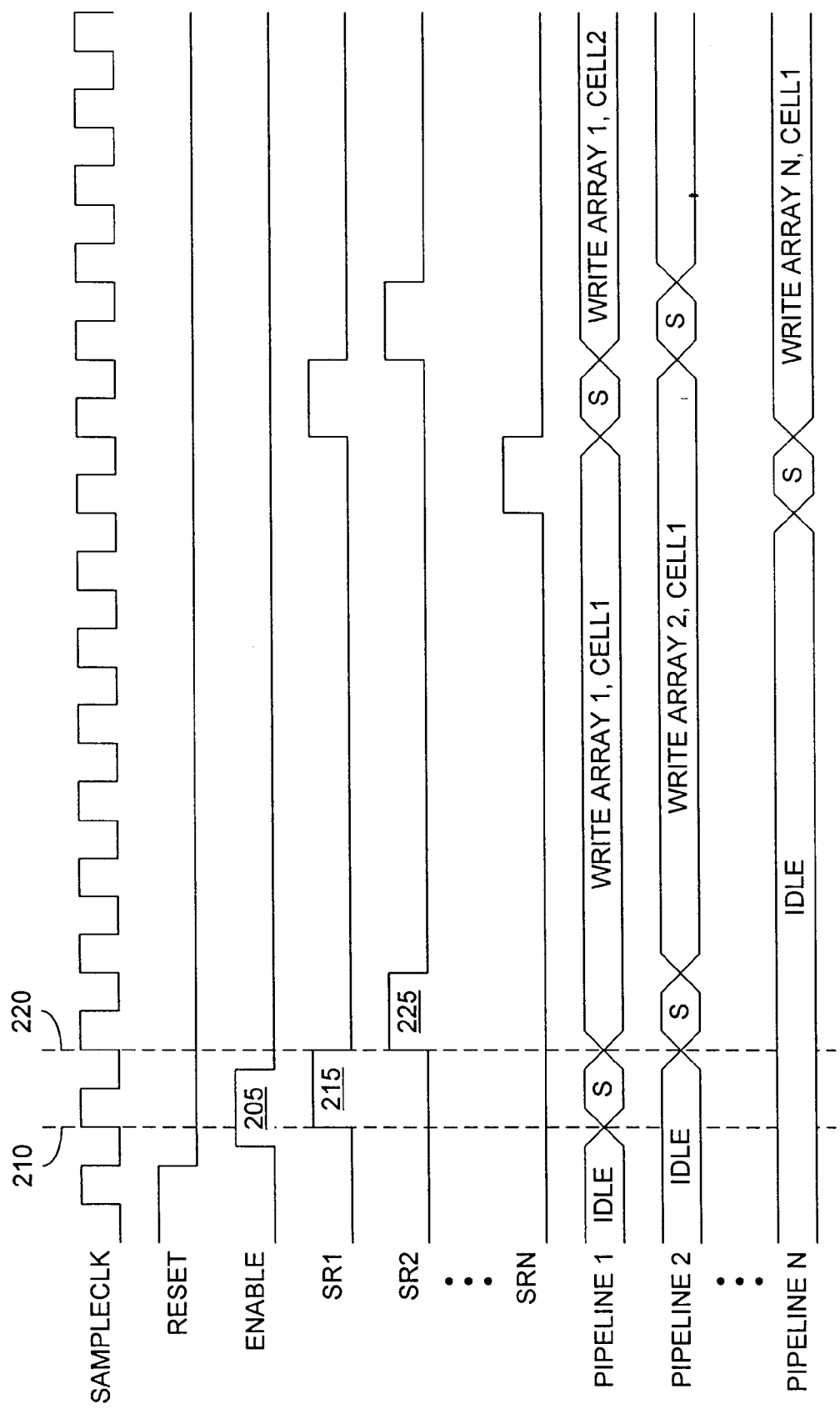
FIG. 2 is a timing diagram for a recording operation performed by the non-volatile memory of FIG. 1.

A recording operation is equivalent to a series of pipelined write operations where one pipelined write operation starts immediately after the other. FIG. 2 shows a timing diagram for a recording operation in memory 100. To start recording operation, a signal ENABLE is asserted to an OR gate 142 in timing circuit 140. OR gate 142 has an output terminal coupled to the data input terminal of flip-flop 144-1. At time 210, the rising edge of a clock signal SAMPLECLK causes flip-flop 144-1 to register the high output signal from OR gate 142 and assert signal SR1 high. In some embodiments, the rising edge of signal SR1 activates data source 125-1. For example, in an analog memory, a sample-and-hold circuit in data source 125-1 can sample an analog input signal in response to the pulse 215 in signal SR1. In a binary or multiple-bits-per-cell memory, data source 125-1 responds to pulse 215 by registering one or more bits of information for writing to memory array 130-1.

At a time 220, signal SAMPLECLK triggers flip-flops 144-1 to 144-N. Flip-flop 144-1 deasserts signal SR1, and flip-flop 144-2 asserts signal SR2. The falling edge of signal SR1 starts write circuit 120-1 on a programming operation that writes the data value from data source 125-1 to the selected memory cell in memory array 130-1. The rising edge of signal SR2 activates data source 120-2 which makes the next data value available to write circuit 120-2. With each consecutive rising edge of signal SAMPLECLK, another write circuit 120 and another data source 125 are activated. For the recording operation, signal RECORD is asserted so that an AND gate 146 passes signal SRN via OR gate 142 to the data input of flip-flop 125. Accordingly, timing circuit 140 asserts signal SR1 the sample clock cycle after asserting signal SRN. The frequency of clock signal SAMPLECLK depends on the required write time and is such that a programming operation started in any of the pipelines 110 completes in less than N clock cycles of signal SAMPLECLK. The recording operation continues cyclically starting programming operations in this fashion until a signal RESET is asserted or signal RECORD is deasserted and a last programming operation begins in pipeline 110-N.

Figure 3:
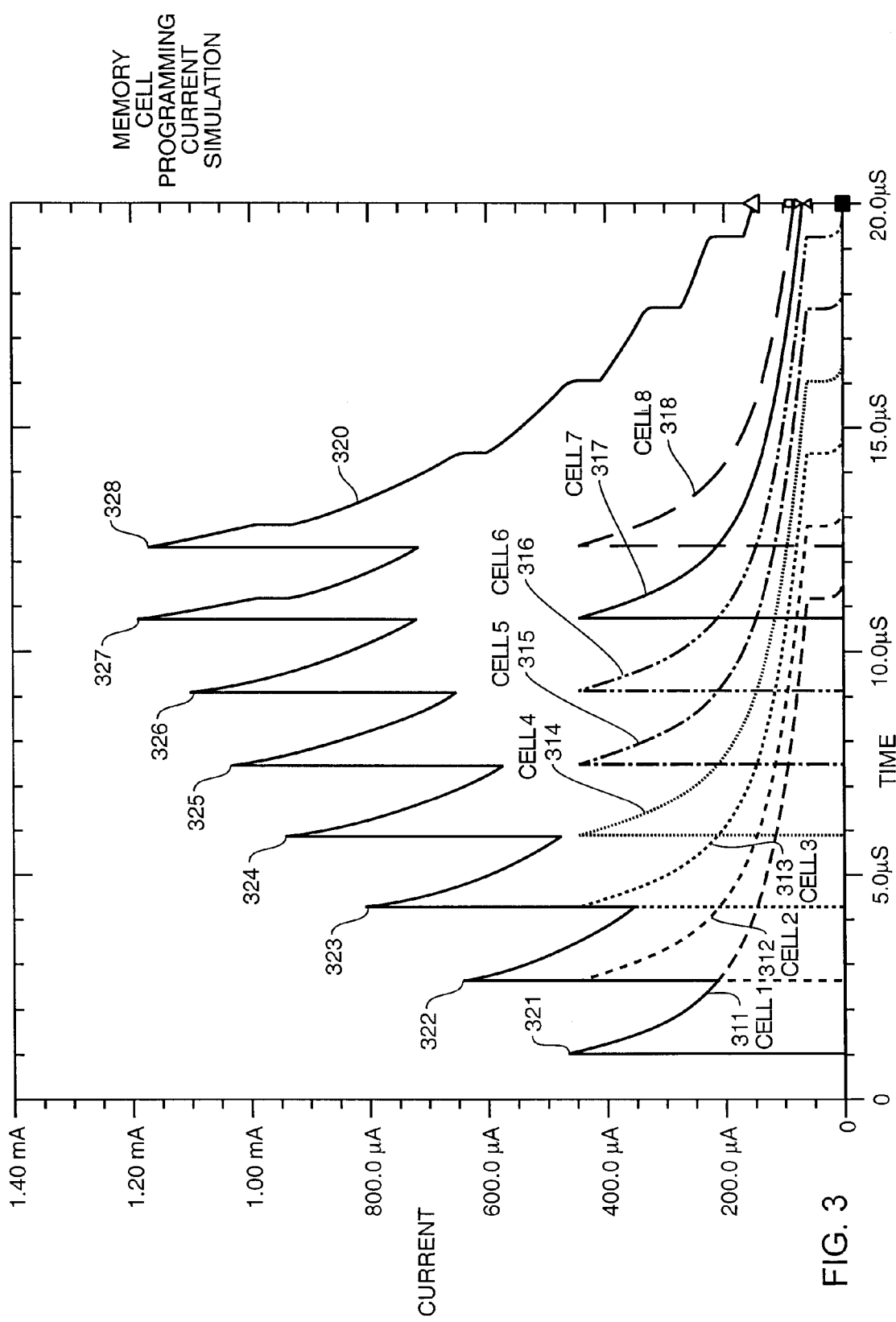
FIG. 3 is a plot of programming current versus time during a pipelined write operation using eight write pipelines.

An advantage of the recording operation and the pipelined write operation over a parallel write operation having the same data rate is a reduction in the maximum current that write circuits 120 draw from shared charge pump 150. FIG. 3 illustrates this advantage by showing a simulation of the current drawn from charge pump 150 for a pipelined write operation when memory 100 includes eight pipelines 110. A characteristic of channel hot electron injection in standard programming operations is that the drain-to-source current through the memory cell almost instantly rises to its maximum level and then decreases with time as the floating gate charges and the threshold voltage of the memory cell rises. For example, FIG. 3 shows a current-versus-time plot 311 for the programming operation in pipeline 110-1. For plot 311, the peak current of about 475 $\mu$A occurs almost immediately after the start of the programming operation. The current drops sharply during programming until little after 10 $\mu$s when the programming operation in pipeline 110-1 is complete and write circuit 120-1 shuts off the current. Current-versus-time plots 312 to 318 are for the independent programming operations in pipelines 110-2 to 110-N (where N is 8) but follow the same pattern as plot 311. Plots 311 to 318 are offset in time relative to each other because timing circuit 140 staggers the starts of the programming operations.

FIG. 3 presumes that programming operations are required in each of eight write pipelines and that the programming time is the same for each programming operation. This presumption provides the highest peak total current and is correct, for example, in a binary memory writing eight bits of value 1 or in analog or multiple-bit-per-cell memories where the row line voltage is selected so that the programming time is constant (e.g., independent of the data value being written.)

Plot 320 is the sum of plots 311 to 318 and indicates the total current drawn from charge pump 150. As shown by plot 320, a maximum total current is about 1.2 mA. In contrast, if programming operations where started simultaneously in pipelines 110-1 to 110-N, the plot of the total current would be shaped like plot 311 but be eight times greater in magnitude. Accordingly, for simultaneously started programming operations, the maximum total current would be about 3.8 mA or more than three times the maximum total current required for the pipelined write operation. Further, the write methods, parallel and pipelined, have the same effective write frequency or data rate because a pipelined write operation permits starting another pipelined write operation immediately after the programming operation in the first pipeline 110-1 is complete even if the programming operation in the last pipeline 110-N has not completed. Accordingly, charge pump 150 can be small to save circuit area and cost and still provide current necessary for a high data rate.

Figure 4:
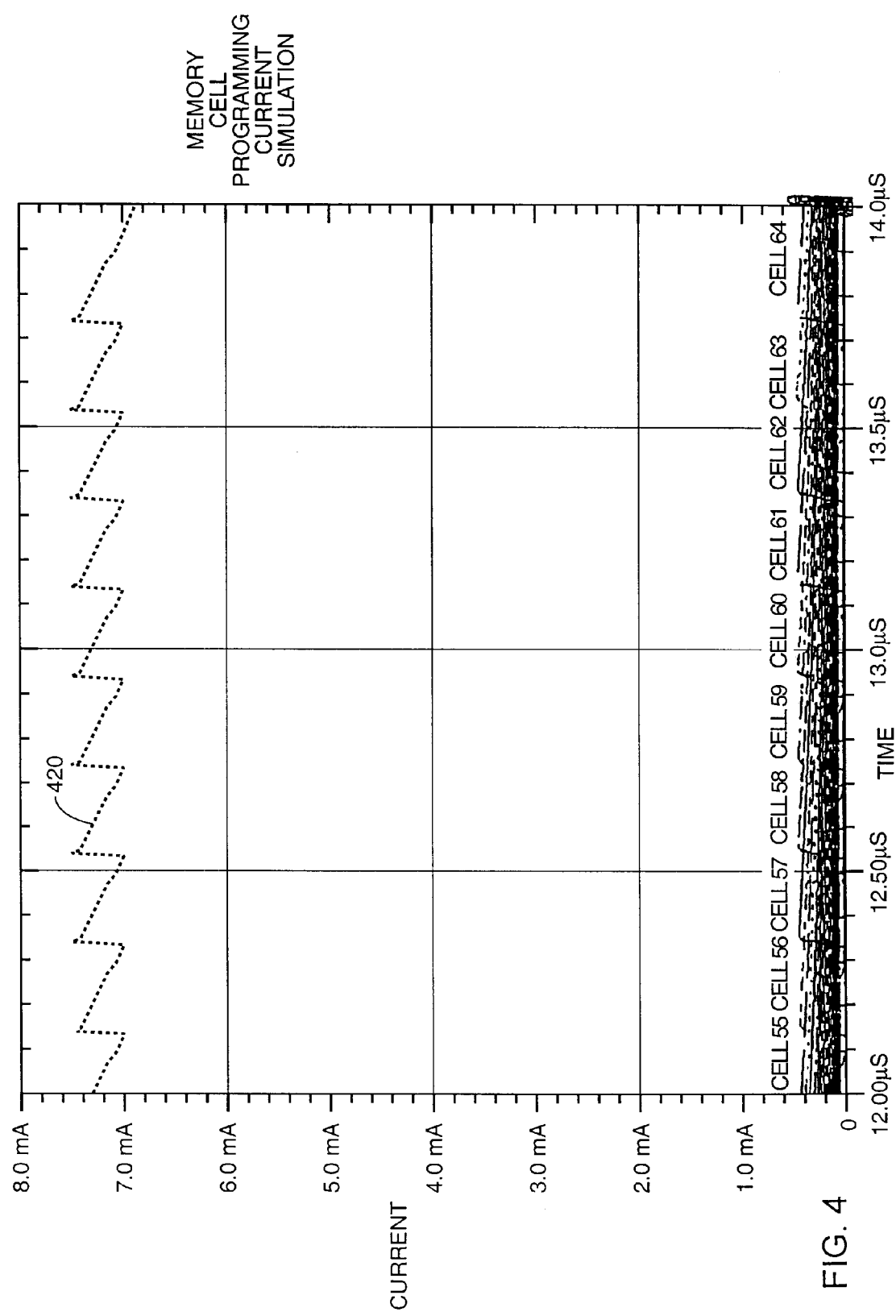
FIG. 4 is a plot of programming current versus time during a pipelined write operation using sixty-four write pipelines.

Another advantage the pipelined write operation with a shared charge pump is that total current drawn has less severe spikes. In particular, each local maxima 321 to 328 in plot 320 is a spike that is less than one eighth as sharp as the spike which would occur for a parallel write operation. Accordingly, noise generated in the memory caused by changing current and voltage drops are reduced in severity. This advantage is better illustrated in FIG. 4 which shows a total current-versus-time plot 420 for the total current drawn from pipelined write operation that writes to sixty-four memory cells. In FIG. 4, the current draw from charge pump 150 remains in a range between about 7.0 and 7.5 mA, rather than being sharply peaked at the start of each write operation. It should be further noted that the maximum total current of about 7.5 mA is only about 13 times greater than the maximum current (about 0.5 mA) for each individual programming operation, and that parallel programming of sixty-four memory cells would require about five times more current than the pipelined write operation.

Figure 5:
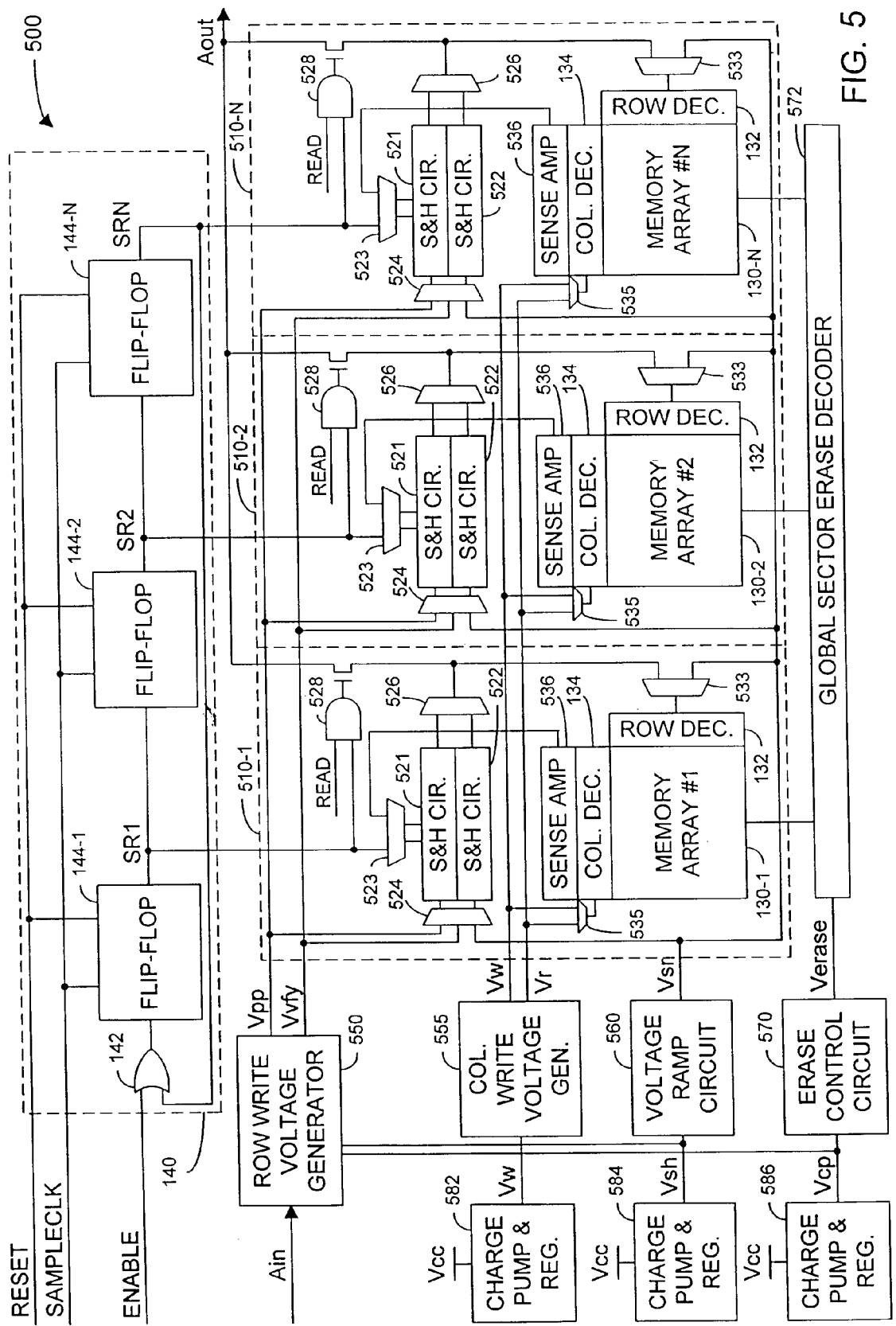
FIG. 5 is a block diagram of an analog or multiple-bits-per-cell non-volatile memory in accordance with an embodiment of the invention.

FIG. 5 is a block diagram of a non-volatile analog memory 500 in accordance with an embodiment of the invention. Memory 500 includes multiple arrays 130-1 to 130-N of non-volatile memory cells in respective read/write pipelines 510-1 to 510-N. Arrays 130-1 to 130-N are non-volatile memory arrays as described above in regard to FIG. 1, and each memory array 130 has a row decoder 132 and a column decoder 134 as described above. Additionally, each array 130 has a sense amplifier circuit 536, which may contain multiple sense amplifiers. Column decoders 134 also connect associated sense amplifier circuits 536 to the associated memory arrays 130 for read operations and for verify operations when writing to an array 130. Sense amplifier circuits and row, column, and erase decoders are well known. As described more fully below, output signals from sense amplifier circuits 536 clock or trigger sample-and-hold circuits or other temporary storage circuits and may include circuitry such as a one-shot circuit in addition to conventional sense amplifier circuitry. U.S. patent Ser. No. 5,687,115, which is hereby incorporated by reference in its entirety, illustrates examples of such circuits.

Memory arrays 130 are separate in that write and read operations in one array 130 do not affect write and read operations in other arrays 130. However, a global sector erase decoder 572 conveys the appropriate bias voltages to source lines for all sectors in arrays 130. For an erase operation, an erase control circuit 570 generates an erase signal Verase (typically about 12 V during an erase) and causes decoder 572 to select one or more sectors in arrays 130. In particular, decoder 572 receives erase signal Verase and one or more address signals identifying one or more sectors selected for erasure. Decoder 572 then applies erase signal Verase to the source lines of the selected sectors and grounds the source lines associated with the unselected sectors. Row decoders 132 ground all of the row lines in the arrays containing one or more of the selected sectors, and column decoders 134 allow all column lines associated with the sectors being erased to float. Erase control circuit 570 uses a voltage generator 586, typically a charge pump with regulator circuits, for generating a high voltage Vcp for erase signal Verase. As described below, erase control circuit 570 shares charge pump 586 with a row write voltage generator 550.

A recording operation or a pipelined write operation sequentially writes a series of values in a number of memory cells. In memory 500, the values written are samples of an analog input signal Ain representing either analog data values or multi-bit digital data values. A playback operation reads and outputs the series of values (or samples from memory 500) to reproduce the recorded sequence (or signal). In one embodiment of the invention, memory 500 uses pipelines 510-1 to 510-N in a staggered fashion during playback to provide a high read data transfer rate. An alternative playback operation performs parallel read operations in pipelines 510 and serially shifts out the values read from the memory cells, if necessary to reproduce the timing of an input signal Ain.

In memory 500, row write voltage generator 550 generates two write signals Vpp and Vvfy from input signal Ain. Write signal Vpp provides a programming voltage that write circuitry applies to the control gate of a memory cell during programming to change the threshold voltage of the memory cell. The voltage of write signal Vpp has a one-to-one correspondence with the present level of input signal Ain. Typically, write voltage generator 550 selects a higher voltage level for signal Vpp when a higher threshold voltages is being written. Appropriate selection of voltage for signal Vpp makes programming time for writing a target threshold voltage nearly independent of the target threshold voltage. Thus, the write resolution is uniform across the range of threshold voltages. Write signal Vvfy, which has a voltage corresponding to the target threshold voltage to be written to the memory cell, is used to accurately determine when the target threshold voltage is reached whereupon the programming operation stops. An interative program-and-verify write process such as described in more detail below minimizes effects of memory cell variation. Alternatively, a timed programming operation stops after a specific time and does not require write signal Vvfy or the circuitry associated with generating or holding signal Vvfy. In this case, one sample-and-hold circuit per pipeline is sufficient.

In the exemplary embodiment memory 500, generator 550 includes voltage shifters that linearly map input signal Ain, which is, for example, in a range from 3 to 6 volts, to signal Vpp in a range from 9 to 12 volts and to signal Vvfy in a range from 3 to 6 volts. Voltage generators for write circuits in analog or multiple-bits-per-cell memories are further described in U.S. patent Ser. No. 5,687,115. Charge pump 586 supplies voltage Vcp to voltage generator 550 for generation of signal Vpp. A charge pump 584 can supply a voltage Vsh, which is greater than the highest threshold voltage, to voltage generator 550 for generation of signal Vfy.

Column write voltage generator 555 provides a constant voltage signal Vw for driving the drain-to-source current through a memory cell during a programming operation and a constant voltage signal Vr for read and verify operations described below. Typically, signal Vw has a voltage between 5 and 6 volts, and a charge pump and voltage regulator circuit 582 generates signal Vw from a supply voltage Vcc between 3 and 5 volts. Signal Vr typically has a voltage of about 1 to 1.5 volts and can be generated from supply voltage Vcc using a voltage divider.

The write circuitry in each pipeline 510 includes row decoder 132, a row line voltage selection circuit 533, column decoder 134, a column line voltage selection circuit 535, sense amplifier circuit 536, sample-and-hold circuits 521 and 522, and multiplexers 523, 524, and 526. (Sample-and-hold circuits 521 and 522 and multiplexers 523, 524, and 526 are involved in both read and write operations.) Multiplexers 523 and 524 are coupled to sample-and-hold circuits 521 and 522 and respectively select trigger signals and input signals for sample-and-hold circuits 521 and 522. For a write operation, multiplexer 523 selects the output signal of the associated flip-flop 144 to trigger both sample-and-hold circuits 521 and 522, and input selection circuit 524 selects and applies signals Vpp and Vvfy to respective input terminals of sample-and-hold circuits 521 and 522. When the output signal from the associate flip-flop 144 transitions, sample-and-hold circuits 521 and 522 sample and store the current voltages of respective write signals Vpp and Vvfy.

Row voltage selection circuit 533 selects the bias voltage that row decoder 132 applies to the selected row line. During a write, row voltage selection circuit 533 selects the voltage from selection circuit 526, and selection circuit 526 alternates between selecting sampled signals Vpp and Vvfy from sample-and-hold circuits 521 and 522 respectively. Row decoder 132 applies the signal VROW from selection circuit 533 to the selected row line and grounds unselected row lines. Column voltage selection circuit 535 selects the bias voltage that column decoder 134 applies to the selected column line. Column decoder 134 allows the voltage on the unselected column lines to float. During a write, voltage selection circuit 535 alternates between selecting signal Vw and signal Vr. More specifically, column voltage selection circuit 535 selects signal Vw for application to the selected column line of the associated array 130 when row voltage selection circuits 526 and 533 select the sample of signal Vpp for application to the selected row of the associated array. Column voltage selection circuit 535 selects signal Vr application to the selected column line of the associated array 130 when row voltage selection circuits 526 and 533 select the sample of signal Vvfy for application to the selected row of the associated array.

Memory 500 uses three internal elevated voltages Vcp, Vsh and Vw which charge pump and voltage regulation circuits 582, 584, and 586 respectively generate from the supply voltage Vcc. Voltage Vcp is normally a 12–13 volt supply which supports all of the on-chip high-voltage needs, including the generation of the erase voltage Verase and the variable control-gate voltage Vpp. Voltage Vcp is also supplied to sample-and-hold circuits 521 for sampling of signal Vpp for a programming operation. Voltage Vsh is a voltage greater than the highest threshold voltage used in a memory cell and is normally a 7–8 volt supply. Voltage ramp circuit 560 uses voltage Vsh when n generating a control-gate voltage signal Vsr for a read operation. Sample-and-hold circuits 521 and 522 use voltage as a supply voltage when sampling signal Vsr during a read, and write voltage generator 550 uses voltage Vsh in generating the variable control-gate signal Vvfy for a verify operation. Voltage Vw is normally a 5–6v supply used for supplying the programming current of the memory cell. Current sourcing requirements for voltages Vcp and Vsh are relatively low since voltages Vcp and Vsh predominantly charge capacitance. Accordingly, charge-pumps 586 and 584 typically require a relatively small area of silicon in an integrated circuit. However, current sourcing requirement of voltage Vw are potentially large. Generally, the current that charge pump 582 must supply depends on the programming current characteristics of the non-volatile memory cell in arrays 130 and the total number of memory cells which need to be programmed at the same time, which in turn is determined by the write data bandwidth requirement.

Figure 6:
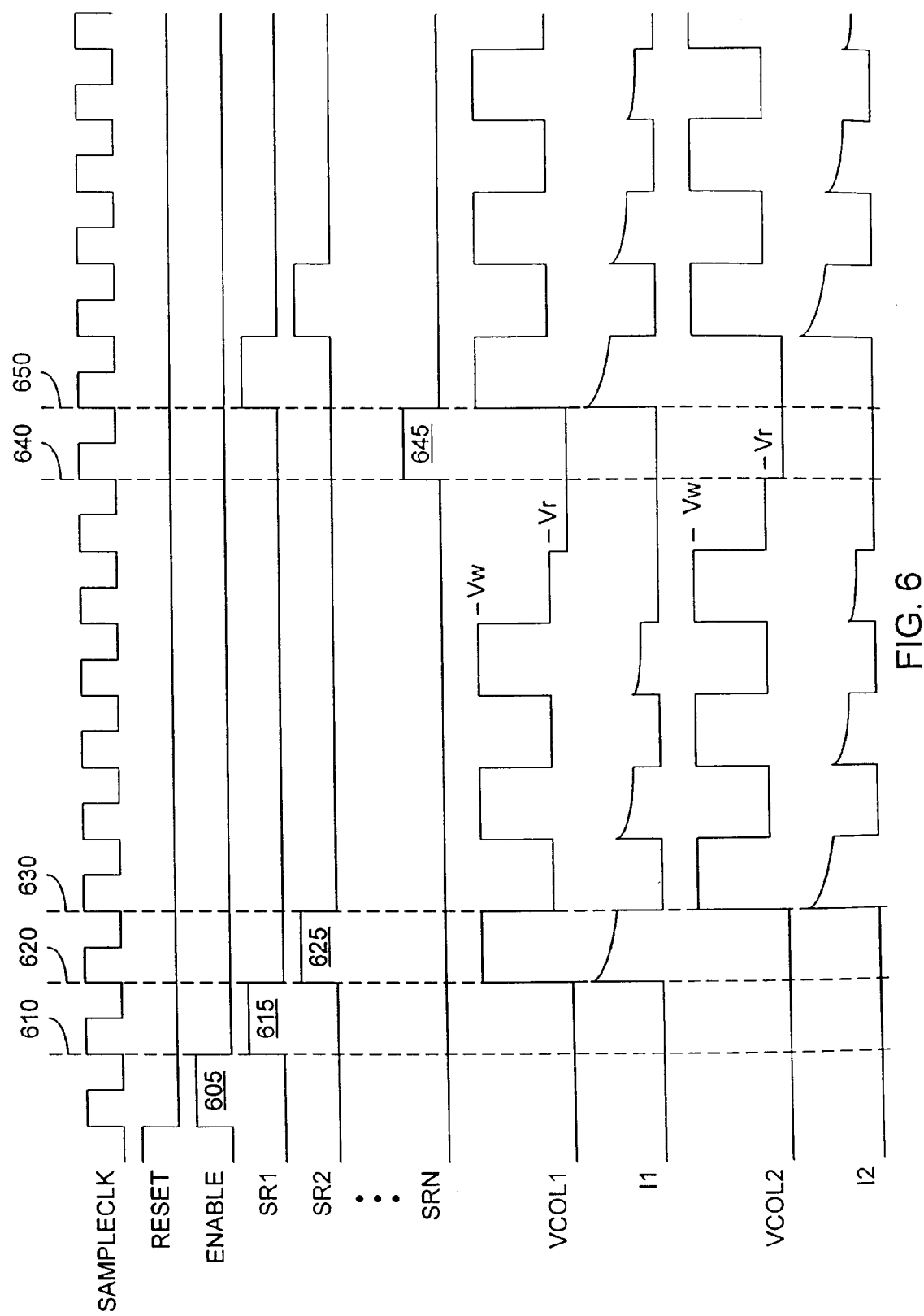
FIG. 6 is a timing diagram for recording operations performed by the memory of FIG. 5.
Figure 1:
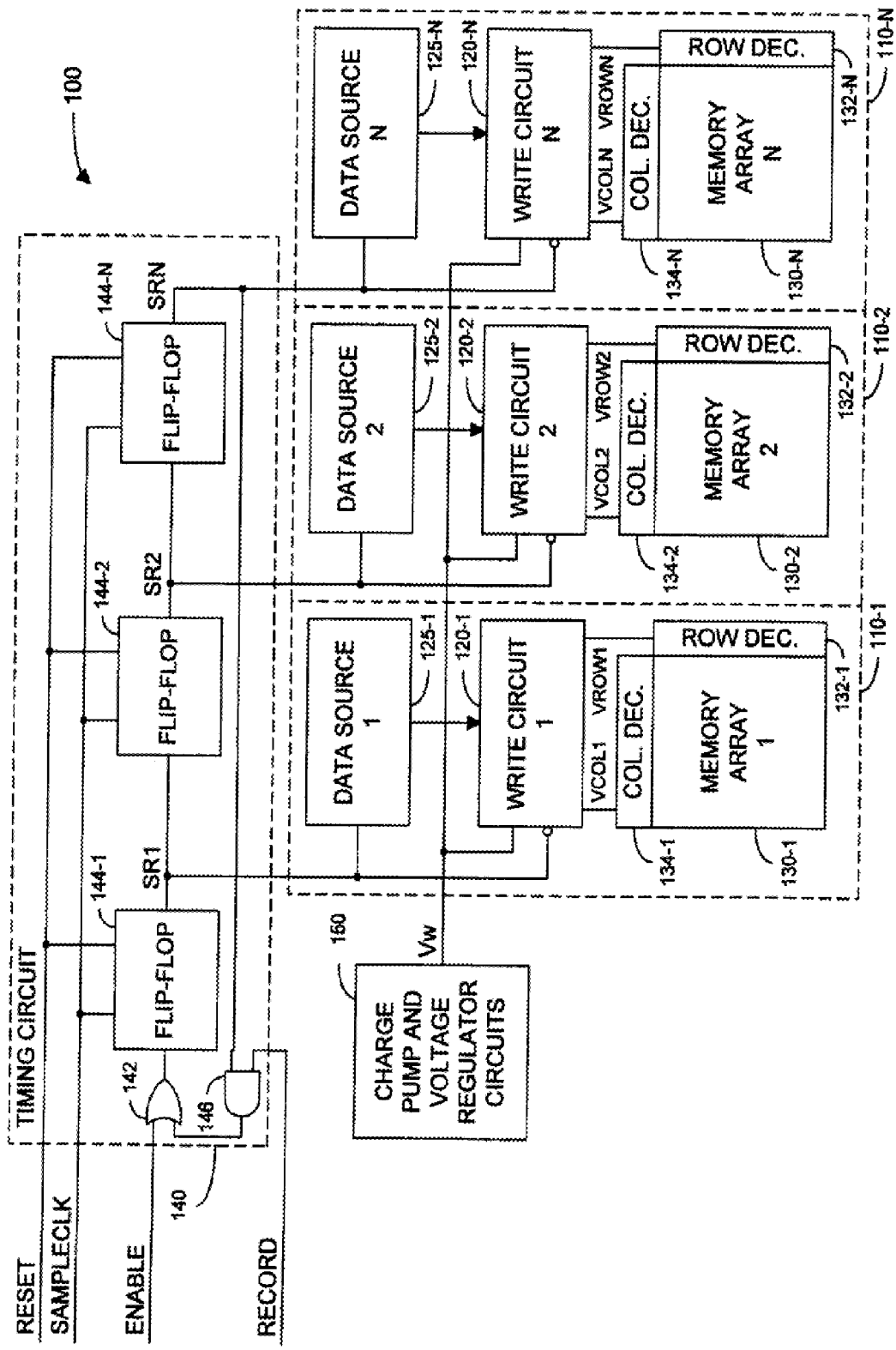
Figure 2:
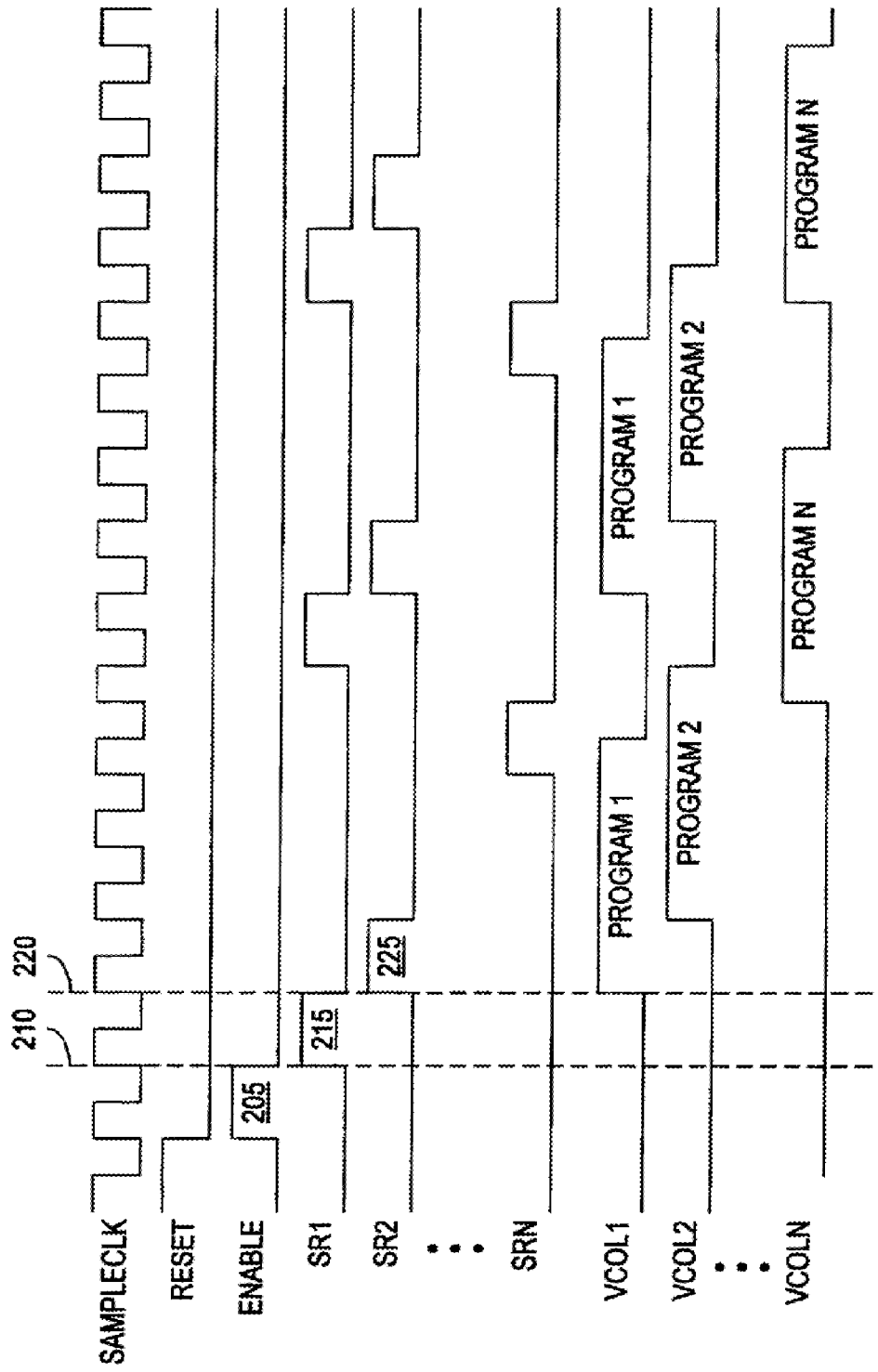
Figure 1:
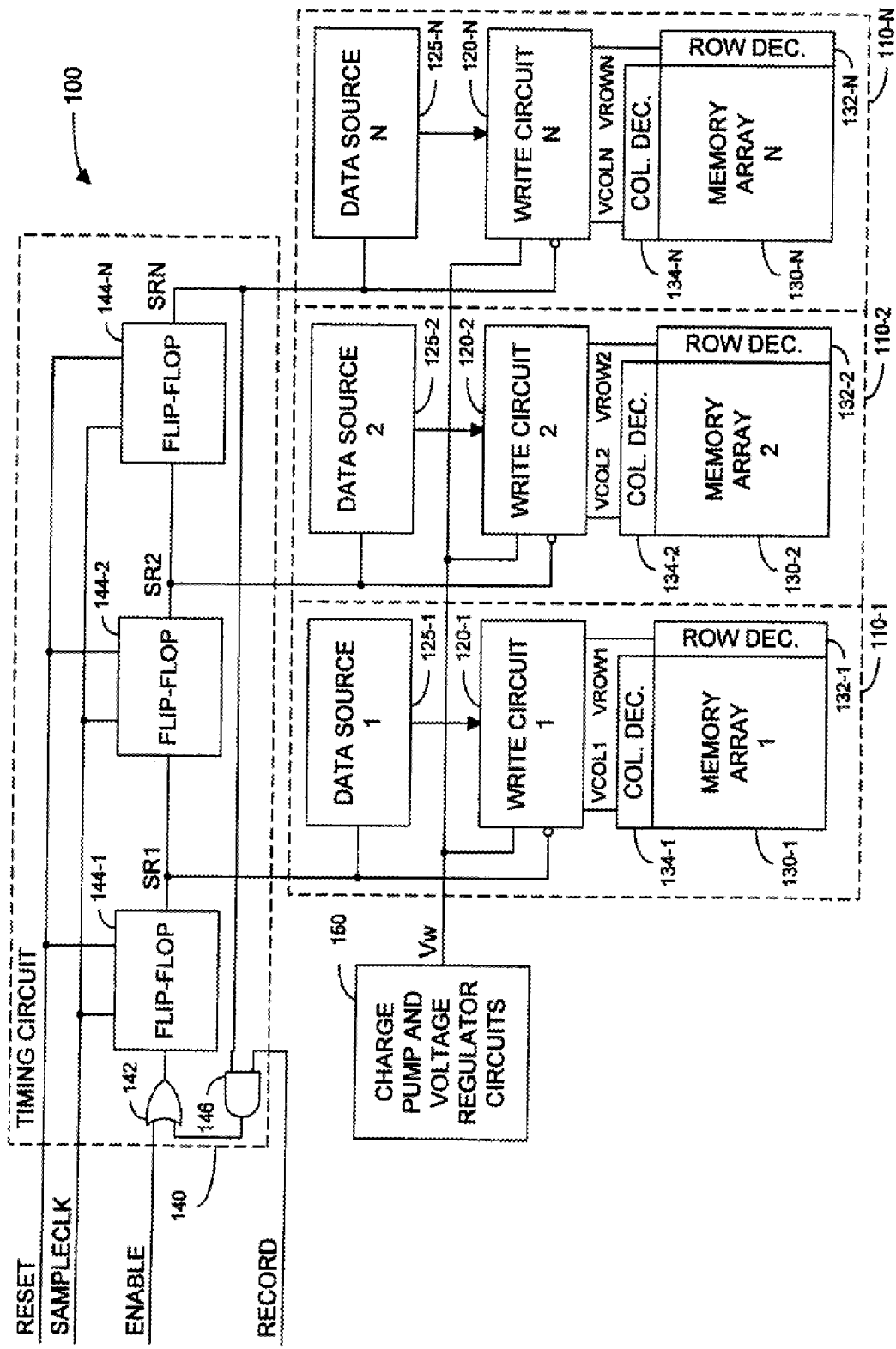
Figure 2:
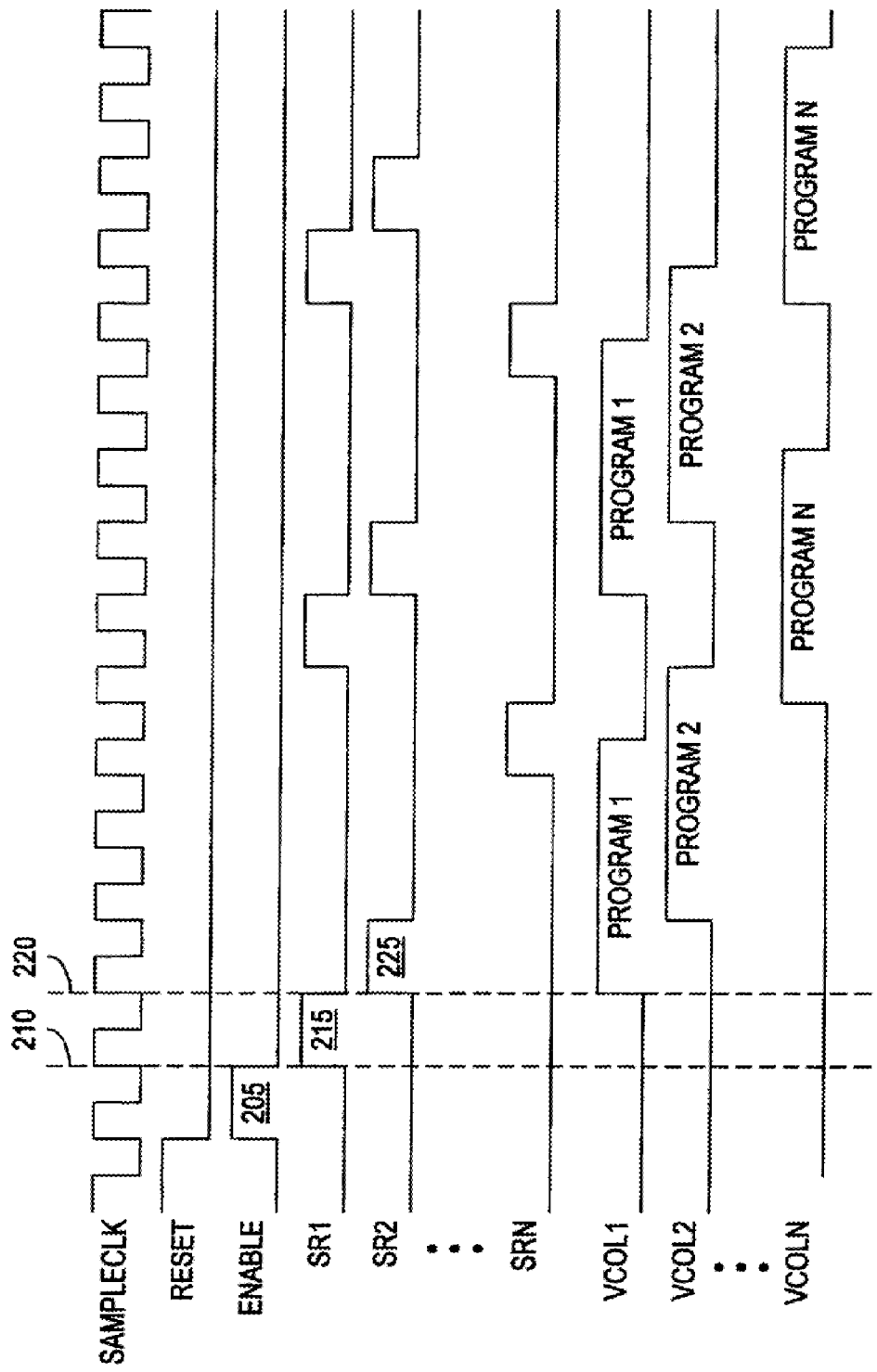

FIG. 6 shows timing diagrams for an exemplary recording process in memory 500. Initially, a signal RESET resets flip-flops 144, and memory arrays 130 are prepared for write operations. For most non-volatile memories such as EEPROM, EPROM, or Flash memory preparation for a write operation includes erasing storage locations to which information will be written. To start recording, signal RESET is deasserted, and a pulse 605 in an input signal ENABLE to OR gate 142 is asserted high for about one clock cycle of a clock signal SAMPLECLK. OR gate 142 provides enable pulse 605 as the input signal to flip-flop 144-1, and output signal SR1 from flip-flop 144-1 goes high at a rising edge 610 of signal SAMPLECLK. Signal SR1 triggers sample-and-hold circuits 521 and 522 in pipeline 510-1. In response to the next rising edge 620 of sampling clock SAMPLECLK, flip-flop 144-1 deasserts signal SR1, and flip-flop 144-2 asserts signal SR2. A pulse thus propagates through flip-flops 144-1 to 144-N, and signals SR1 to SRN sequentially trigger sample-and-hold circuits 521 and 522 in pipelines 510-1 to 510-N. Each pipeline 510 thus begins sampling write signals Vpp and Vvfy at different times. The last flip-flop 144-N is coupled to an input terminal of OR gate 142 so that signal SR1 is asserted again after signal SRN. The recording process continues starting write operations by cyclically triggering sample-and-hold circuits 521 and 522 until signal RESET stops the pulse from propagating around the ring of flip-flops 144.

During a write, sample-and-hold circuits 521 and 522 in pipelines 510-1 to 510-N sample write signals Vpp and Vvfy in response to the corresponding signals SR1 to SRN. When signal SR1 is asserted at time 610, sample-and-hold circuits 521 and 522 in pipeline 510-1 sample write signals Vpp and Vvfy, and pipeline 510-1 begins writing in a memory cell of array 130-1 a value that signal Ain represented during interval 615. When signal SR2 is asserted at time 620, sample-and-hold circuits 521 and 522 in pipeline 510-2 sample write signals Vpp and Vvfy, and pipeline 510-2 begins writing in a memory cell of array 130-2, a value signal Ain represented during interval 525. Each row voltage select circuits 538 uses the sampled values of the write signals Vpp and Vvfy from multiplexer 526 for a write process that sets the threshold voltage of a selected memory cell to a target threshold voltage. The target threshold voltage is the level that represents the voltage of input signal Ain when write signals Vpp and Vvfy were sampled.

The write process for memory 500 includes generating a series of programming cycles that are interleaved with verify cycles. FIG. 6 shows the example of write processes that start with a programming cycle, but an alternative write process can begin with a verify cycle. During each programming cycle, multiplexer 526 selects the Vpp sample from sample-and-hold circuit 521, and row decoder 132 applies the sampled voltage to a row line selected according to an input address signal identifying a selected memory cell in array 130. Voltage Vpp is typically in the range from 9 to 12 volts. Row decoder 132 grounds unselected row lines. Selection circuit 535 selects voltage Vw during a programming cycle, and column decoder 134 applies voltage Vw to the column line connected to the selected memory cell and grounds unselected column lines. Decoder 572 grounds the source line of the sector containing the selected memory cell. The combination of voltages applied to the control gate, source, and drain of the selected memory cell during a programming cycle causes channel hot electron injection into the floating gate of the selected memory cell and increases the threshold voltage of the selected memory cell.

During a verify cycle, multiplexer 526 selects the Vvfy sample from sample-and-hold circuit 522. Row decoder 132 applies the sampled level of signal Vvfy to the selected row line and grounds the unselected row lines. Select circuit 135 selects read voltage Vr, and column decoder 134 applies read voltage Vr and connects sense amplifier 536 to the selected column line. Column decoder 134 grounds the unselected column lines. Decoder 572 continues to ground the source line coupled to the selected memory cell. When the programming cycles raise the threshold voltage of the selected memory cell to the sampled level of signal Vvfy, sense amplifier 536 senses during a verify cycle that the memory cell does not conduct and sends a signal to stop further programming cycles. Programming cycles can be stopped for example, by stopping further applications of sampled voltage Vpp to the selected row line, stopping application of voltage Vw to the selected column line, or both. Thus, the programming cycles raise the threshold voltage to the level of sampled voltage Vvfy and then stop. The available write time for a pipeline 510 is N times the period of clock signal SAMPLECLK where N is the number of pipelines 510. Accordingly, the number of pipelines can be selected according to the required write time per pipeline 510 and the desired write frequency. For example, with a write time Tw of 10 μs, 64 pipelines are required to achieve a sampling rate of 6.4 MHz.

In the exemplary recording operation illustrated in FIG. 6, both programming cycles and verify cycles are one clock cycle of signal SAMPLECLK in duration. To achieve this, the frequency of signal SAMPLECLK and the duration of each programming cycle is selected according to the minimum time required for a verify cycle. Additionally, the starts of programming operations are separated by one clock cycle. For example, pipeline 510-1 starts a first programming cycle at a time 620 in response to the pulse 615 in signal SR1 from timing circuit 140. During the programming cycle, the signal VCOL1 applied to the selected column line in array 130-1 is at voltage Vw, and charge pump 582 supplies a current I1 that flows through array 130-1. Current I1 falls during the programming cycle in the characteristic fashion of channel hot electron injection. At time 630, selection circuit 535 in pipeline 510-1 switches signal VCOL1 to read voltage Vr for a verify cycle, and current I1 from charge pump 582 through array 130-1 stops. Also at time 630 when pipeline 510-1 starts the verify cycle, pipeline 510-2 starts a programming cycle. Accordingly, pipelines 510-1 and 510-2 never perform programming at the same time. More generally, only odd numbered pipelines perform programming cycles at the same time as pipeline 510-1, and only even numbered pipelines perform programming cycles at the same time as pipeline 510-2. This effectively cuts the peak current as well as the average current drawn from charge pump 582 in half because at most one half of the pipelines 510 simultaneous performing programming. Additionally, since write operations in pipelines 510 start at different times, most of the programming cycles simultaneously being performed draw much less than the peak programming current for the memory cell. Both factors contribute to significantly reducing the peak total current when compared to a parallel programming operations.

In an alternative embodiment, the duration of a programming cycle can be different from the duration of a verify cycle. Further, the offset between starts of write operations in sequential pipelines can be different from the duration of either a programming cycle or a verify cycle. Staggering the starts of write operations still reduces the peak current when compared to conventional parallel write operations.

For the recording process of FIG. 6, pipelines 510 are effectively partitioned into two banks of pipelines where pipelines in one bank perform programming cycles when pipelines in the other bank perform verify cycles. In other embodiments, pipelines 510 can be partitioned into three or more banks where the pipelines that are in the same bank start programming cycles at the same time, but pipelines in different banks start programming cycles at different times. For example, if a verify cycle is twice the duration of a programming cycle, pipelines 510 can be partitioned into three banks where pipelines in the second bank start programming cycles when programming cycles of pipelines in the first bank end, pipelines in the third bank start programming cycles when programming cycles of pipelines in the second bank end, and pipelines in the first bank start programming cycles when programming cycles of pipelines in the third bank end. Accordingly, only one bank at a time performs programming cycles. This cuts the current from a shared charge pump by two thirds when compared to starting programming operations simultaneously in all of the write pipelines. A similar technique when the programming cycles are twice as long as the verify cycles has two banks at a time performing programming cycles and reduces current by one third. Other partitions of pipelines 510 into banks and staggering of the starts of programming cycles for the banks can be selected according to the ratio of the duration of a programming cycle to the duration of a verify cycle. Additionally, as described above, pipelines within a bank can start programming operations at different times so that at most one pipeline at a time is performing the first programming cycle of a write operation.

Although the invention has been described with reference to particular embodiments, the description is only an example of the invention's application and should not be taken as a limitation. In particular, even though much of preceding discussion was aimed at staggering programming operations that program single memory cell in an array, alternative embodiments of this invention include staggering programming operations where each programming operation programs multiple memory cells in the array. Various other adaptations and combinations of features of the embodiments disclosed are within the scope of the invention as defined by the following claims.

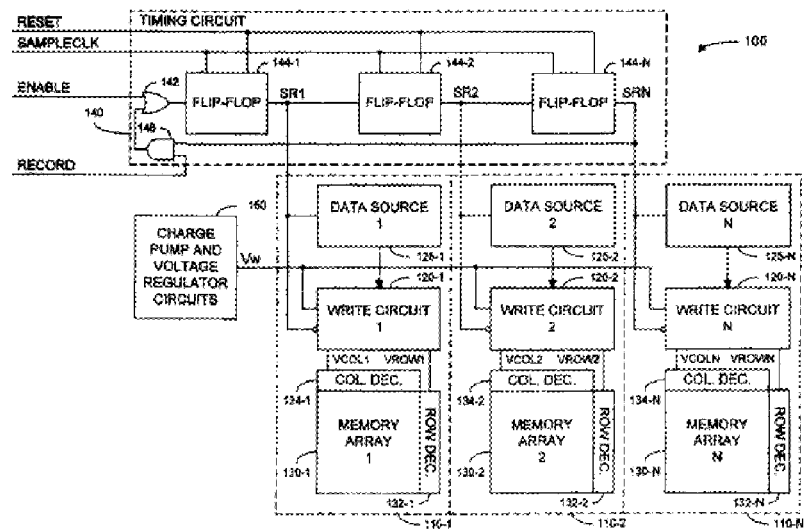

What is claimed is:

1. A method of writing a stream of continuous data in a non-volatile memory, comprising:

receiving the stream of continuous data;

cyclically recording the stream of continuous data in a plurality of N pipelines ordered one through N, wherein each of the pipelines contain a plurality of memory cells and said cyclically recording comprises starting a programming operation to program a memory cell in each of said pipelines according to the ordering, wherein starting the programming operation in a pipeline in the ordering occurs after starting the programming operation in the preceding pipeline in the ordering but before the programming operation in the preceding pipeline in the ordering is complete, and wherein starting a programming operation the first pipeline in the ordering after the first programming operation in the first pipeline occurs after starting the programming operation in pipeline N in the ordering but before the programming operation in pipeline N in the ordering is complete, and wherein the programming operations include connecting a charge pump to drive a current through said memory cell in each of said pipelines in order to write a segment of the stream of continuous data in said first memory cells;

asserting a control signal; and stopping said cyclically recording in response to said asserting a control signal.

2. The method of claim 1, wherein the programming operations comprise keeping the charge pump coupled to drive the current through said memory cell in each of said pipelines for a fixed time.

3. The method of claim 2, wherein the fixed time is sufficiently long that the programming operation changes a threshold voltage of a memory cell from a level representing a first binary level to a level representing a second binary value.

* * * * *

UNITED STATES PATENT AND TRADEMARK OFFICE
CERTIFICATE OF CORRECTION

PATENT NO.          : 6,314,025 B1                                       Page 1 of 3
APPLICATION NO. : 09/670764
DATED                  : November 6, 2001
INVENTOR(S)        : Sam C. Wong It is certified that error appears in the above-identified patent and that said Letters Patent is hereby corrected as shown below:

Please replace Figures 1 and 2 with Replacement Sheets 1 and 2.

Signed and Sealed this

Twenty Second Day of April, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,314,025 B1 |
| APPLICATION NO. | : 09/670764 |
| DATED | : November 6, 2001 |
| INVENTOR(S) | : Sam C. Wong |

It is certified that error appears in the above-identified patent and that said Letters Patent is hereby corrected as shown below:

Delete the title page and substitute therefor the attached title page.
Please replace Figures 1 and 2 with Replacement Sheets 1 and 2.

This certificate supersedes the Certificate of Correction issued April 22, 2008.

Signed and Sealed this

Third Day of June, 2008

JON W. DUDAS
*Director of the United States Patent and Trademark Office*

(12) United States Patent
Wong

(10) Patent No.: US 6,314,025 B1
(45) Date of Patent: Nov. 6, 2001

(54) HIGH DATA RATE WRITE PROCESS FOR NON-VOLATILE FLASH MEMORIES

(75) Inventor: Sau C. Wong, Hillsborough, CA (US)

(73) Assignee: Sandisk Corporation, Sunnyvale, CA (US)

(*) Notice: Subject to any disclaimer, the term of this patent is extended or adjusted under 35 U.S.C. 154(b) by 0 days.

(21) Appl. No.: 09/670,764

(22) Filed: Sep. 27, 2000

Related U.S. Application Data

(63) Continuation of application No. 09/128,225, filed on Aug. 3, 1998, now Pat. No. 6,134,145, which is a continuation-in-part of application No. 09/103,623, filed on Jun. 23, 1998, now Pat. No. 5,969,986.

(51) Int. Cl.$^7$ .................................. G11C 16/00
(52) U.S. Cl. ...................... 365/185.22; 365/185.11; 365/185.28
(58) Field of Search ........................ 365/185.11, 185.22, 365/185.23, 185.28, 185.29, 185.33, 230.03; 711/169

(56) References Cited

U.S. PATENT DOCUMENTS

| | | | |
|---|---|---|---|
| 4,054,864 | 10/1977 | Audaire et al. | 340/173 |
| 4,057,788 | 11/1977 | Sage | 365/174 |
| 4,181,980 | 1/1980 | McCoy | 365/45 |
| 4,200,841 | 4/1980 | Nagata et al. | 455/169 |
| 4,318,188 | 3/1982 | Hoffman | 365/45 |

(List continued on next page.)

FOREIGN PATENT DOCUMENTS

| | | |
|---|---|---|
| 3644322 | 7/1988 | (DE) . |
| 0798739 | 10/1995 | (EP) . |

OTHER PUBLICATIONS

Press Release: Intel Announces Multilevel Cell Flash Technology, Intel Corporation, 1994, 3 pages.
"Solutions OEM," A Publication of Intel Corporation, vol. 2, No. 2, (Autumn) Sep. 1994, pp. 1–8.

(List continued on next page.)

*Primary Examiner*—Tan T. Nguyen
(74) *Attorney, Agent, or Firm*—Skjerven Morrill MacPherson LLP

(57) ABSTRACT

A non-volatile semiconductor memory includes: multiple write pipelines, each including a memory array; a timing circuit which sequentially starts programming operations in the pipelines; and a shared charge pump and voltage regulation circuit that drives a current through the memory cells being programmed. Staggering the starts of programming operations reduces the current demand on the charge pump because spikes that occur at the starts of programming operations, for example, when using channel hot electron injection, are distributed over time rather than occurring all at once. Noise, which can reduce the accuracy of write operations, is also reduced because the total current required from the charge pump is more nearly constant. As further aspect of the invention, each write pipeline can perform a write operation as alternating programming cycles and verify cycles. During a programming cycle, the shared charge pump drives a current through a selected memory cell to change the threshold voltage of the selected memory cell. During a verify cycle, the write circuit determines whether the selected memory cell has reached its target threshold voltage level. The write pipelines can be partitioned into two banks where pipelines in one bank perform programming cycles while pipelines in the other bank perform verify cycles. More generally the write pipelines are partitioned into multiple banks where each bank starts programming cycles at times that differ from the starts of programming cycles in the other banks.

3 Claims, 6 Drawing Sheets